United States Patent [19]
Hebert

[11] Patent Number: 4,649,415
[45] Date of Patent: Mar. 10, 1987

[54] SEMICONDUCTOR PACKAGE WITH TAPE MOUNTED DIE

[75] Inventor: David F. Hebert, Hayward, Calif.

[73] Assignee: National Semiconductor Corporation, Santa Clara, Calif.

[21] Appl. No.: 691,996

[22] Filed: Jan. 15, 1985

[51] Int. Cl.⁴ .................. H01L 23/02; H01L 23/12
[52] U.S. Cl. .................. 357/74; 174/52 FP; 357/70; 357/72; 357/80
[58] Field of Search ........... 357/74, 80, 70, 79, 357/72; 174/52 FP

[56] References Cited
U.S. PATENT DOCUMENTS

| | | | |
|---|---|---|---|
| 3,404,214 | 10/1968 | Elliott | 174/52 |
| 3,868,724 | 2/1975 | Perrino | 357/70 |
| 4,234,666 | 11/1980 | Gursky | 357/70 |
| 4,524,238 | 6/1985 | Butt | 357/81 |

FOREIGN PATENT DOCUMENTS 1937638 2/1970 Fed. Rep. of Germany ........ 357/74

Primary Examiner—James W. Davie
Assistant Examiner—Georgia Y. Epp
Attorney, Agent, or Firm—Gail W. Woodward

[57] ABSTRACT

A semiconductor package has a molded-in-place lead frame (15) resting on a ledge (12b) adjacent a die-receiving trough (13) in a molded housing (10). A one-layer or two-layer flexible tape includes a depending tab (22) on which a die (30) is bonded and positioned within the trough. Electrical bonds are made between bond pads (42) on the die, either by wire bonds (29) or thermocompression bonding using connector bumps (32), and bond pads on the tape. The tape is laid across a pair of ledges (12a, 12b) with the depending die resting on the bottom of the trough. The tape bond pads are then bonded to inner-extending contact fingers (18) of the lead frame. A single-in-line package is provided in one embodiment wherein integral contacts (17) extend outwardly from fingers (18) exterior of the housing (10).

15 Claims, 9 Drawing Figures

SEMICONDUCTOR PACKAGE WITH TAPE MOUNTED DIE

BACKGROUND OF INVENTION

1. Field of Invention

The present invention relates to a tape automatic bonding process for packaging of a semiconductor die and resultant semiconductor die package.

2. Prior Art

Heretofore various tape automatic bonding (TAB) processes and techniques have been employed in packaging semiconductor devices such as integrated circuit chips. A strip of metal tape rolled on a reel form provides multiple arrays of finger-like contacts to which bond pads of an IC die are bonded at an inner end and are bonded to a lead frame at their outer ends to form part of an overall IC die package. This TAB process is seen, for example, in U.S. Pat. 4,234,666 where arrays or clusters of leads on single-layer copper foil are formed for attachment at inner ends to a chip and outer ends subsequently bonded to stiff outer leads. U.S. Pat. No. 4,253,436 discloses a TAB process utilizing a two-layer tape where attached foil is etched to form lead terminals thereon.

SUMMARY OF INVENTION

A semiconductor package is formed using a tape automated bonding process in which a flexible insulative tape having conductive bond pads thereon is bonded to a conductive lead frame molded into a side wall of a package housing and supported by a pair of interior ledges. The housing has a longitudinally-extending trough between the ledges for receiving semiconductor die(s) mounted on a depending integral tab extending from the tape. The top surface of the die is generally coplanar with the ledge so that the die contact pads can be wire bonded or otherwise attached to lead attach pads on the tape, normally after mounting the tape across the housing ledges. The integral tab may be metallized to provide a die backside electrical contact. When employing two-layer tape e.g. a copper foil on a flexible insulative substrate, a metallic via may electrically connect the top side of the tape to lead attach pads which are then bonded to the contacts of the lead frame. In the use of one-layer tape e.g. copper foil per se, the foil is directly connected to the lead frame and die bond pads, and after assembly or during bonding, connecting portions or links excised or blanked out in both the tape and lead frame to form separate conductive paths extending between die bond pads and lead frame flat pin contacts. The lead frame may provide a single-in-line package, as shown, or dual-in-line package.

DETAILED DESCRIPTION

Figure 1:
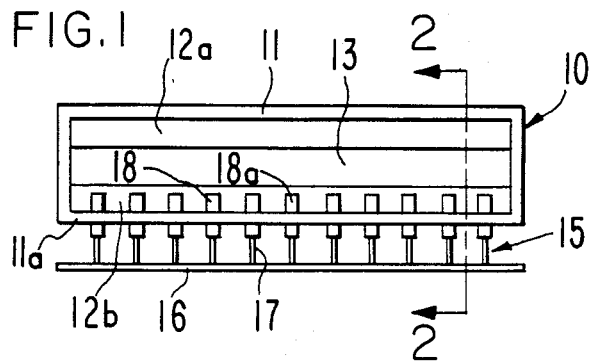
FIG. 1 is a top view of the package housing prior to tape insertion.
Figure 2:
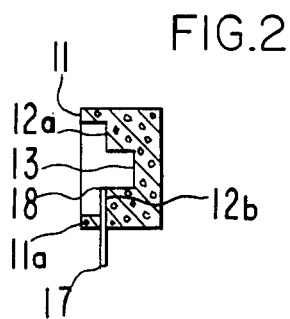
FIG. 2 is a cross-sectional view of the housing taken on the line 2—2 of FIG. 1.

FIGS. 1 and 2 show a housing 10 comprising a peripheral raised upstanding side wall or dam 11. A longitudinal trough or groove 13 extends between interior side ledges 12a, 12b in a plane between the top of dam 11 and bottom of trough 13. A lead frame 15 comprising outwardly-extending pin contacts 17 and inwardly-extending contact fingers 18 is molded in a side wall 11a of the housing. Fingers 18 rest on ledge 12b. Pin contacts 17 are ganged together for structural handling purposes by frangible integral links 16 extending between each pin contact.

Figure 3:
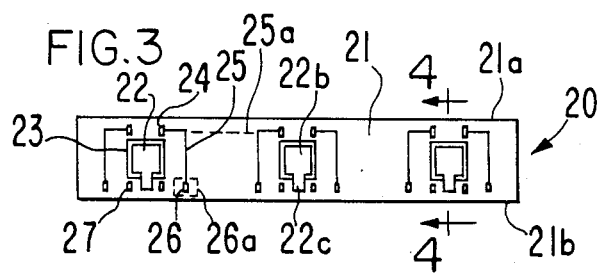
FIG. 3 is a plan view of a two-layer tape prior to attachment of a die and insertion into the package housing.
Figure 4:
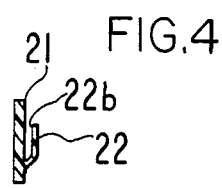
FIG. 4 is a cross-sectional view of the tape taken on the line 4—4 of FIG. 3.

FIGS. 3 and 4 illustrate a tape 20 which is insertible into housing 10. Tape 20 comprises a two-layered tape having an insulative flexible substrate 21 with a series of integral depending tabs 22 punched out from Q apertures 23 in the tape. As is known, the tape may contain sprocket holes (not shown) at its edges for moving and indexing the tape into assembly process positions. Tab 22 may be metallized at 22b by an etched foil on its top surface to provide a backside electrical contact for a semiconductor die mountable on the tab. Such metallization may be subsequently connected at pad 22c to a contact finger for example 18a. Conductive bond pads 24, 27 are formed on the tape adjacent the apertures 23 to be bonded to the bond pads on the tab-attached die. Suitable electrical metallization pathways 25 may be provided extending from one edge 21a of the tape to the other edge 21b to provide for a single-in-line connection pad 26 to which is connectible to the contact finger of the lead frame as hereafter explained. A connection may be made to an adjacent die or other device by providing a through hole along line 25 to the backside of the tape and a conductive path 25a provided on the tape for connection thereto.

Figure 5:
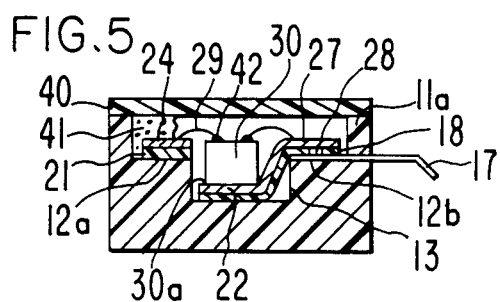
FIG. 5 is a cut-away, cross-sectional view transverse of the overall housing with a die-mounted two-layer tape in the interior and a cover.

FIG. 5 shows a preferred embodiment of a completed package wherein a die 30 is bonded by conductive cement 30a such as silver-filled epoxy, for example EPO-TEK H20E sold by Epoxy Technology Inc., Billerica, Mass., to a metallized surface of tab 22 and rests on the tab on the bottom of trough 13. The longitudional edges of tape substrate 21 rests on ledges 12a, 12b, with one edge particularly extending over contact fingers 18, the latter premolded in place in housing sidewall 11a. Wire , bonds 29 extend from bond pads 42 on the die 30 to the tape bond pads 24, 27 on the insulative substrate 21. As seen in the FIG. 6 and detail 26a (FIG. 3) a via or plated-through hole 28 is provided through substrate 21 to electrically connect pad 26 to the contact fingers 18. As can be seen, the top of die 30 is generally coplaner with the ledges 12a, 12b and the tape 20 overlying the ledges, to provide for ease of manufacture.

Tape substrate typically is of polyimide material with a width of 0.5 inches and thickness of 0.005 inches. A copper foil of 0.0005 inches is bonded to the substrate and the discrete tape bond pads are formed by etching away unnecessary areas of foil.

In the preferred embodiment, the die is wire bonded to the pads 24, 27 after the placement of the tape and die across the ledges. The plated through-holes 28 extend to the underside of the tape and can be solder plated for reflow solder attachment to contact fingers 18 or otherwise attached by thermocompression bonding or thermosonic or ultrasonic bonding. Upon completion of the electrical connections, die-to-tape and tape-to-contact fingers, the assembly within the housing may be protected by a coating either conformal or planar or by an encapsulant 41 such as Furane 7702 sold by Furane, Los Angeles, Calif., extending up to the top of wall or dam 11a (shown only in part of the cavity around the inner assembly). The housing can be capped by a plastic or other cover 40 bonded to the top of dam 11a.

The housing 10 and cover 40 is normally made of a polymeric thermoplastic material, such as polyethersulfone, polyethyerimide or polyphenylene sulfide. Anodized aluminium powder or flakes may be added to maximize the thermal conductivity of the housing and cover without the housing and cover material becoming electrically conductive. The housing has a thermal conductivity of from 10 to 30 cal/sec/cm/° C. and an electrical resistivity of more than $8 \times 10^{-13}$ ohms at 100° C.

The construction shown in FIG. 5 lends itself to automated assembly techniques including tape automated bonding. It provides for a densely packed die or memory construction at relatively low cost. The device is pretestable prior to final encapsulation and after the links 16 have been excised from the lead frame to form separated pin contacts 17 extending from the housing. Alternatively the wire bond in FIG. 5 may be replaced by direct connection of the die bond pads to the tape bond lg pads by a foil similar to that shown in FIG. 8.

Figure 6:
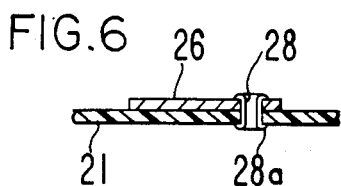
FIG. 6 is a detail view in cross-section of the connection outlined in the dotted circle in FIG. 3 between a cross-over trace and a contact finger.

FIG. 6 illustrates a plated-through hole 28 through substrate 21 and in contact with tape bond pad 26. When placed on the ledge the plated hole bottom edge 28a is in conductive contact with finger 18 of the lead frame. This provides an input or output connection from the chip and trace 25 to an exterior pin connection 17.

Figure 7:
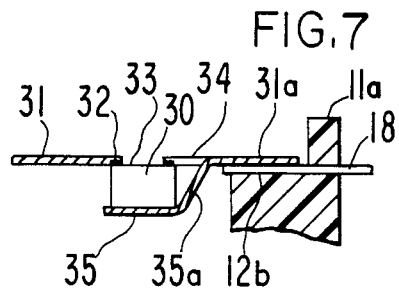
FIG. 7 is a partial cross-sectional view of sinlge layer tape showing its connection to a molded-in-place lead from contact finger.

FIG. 7 illustrates a second embodiment of the invention wherein one-layer copper foil tape 31 may be employed. A tab 35 is punched or otherwise cut out of aperture 34 and die 30 bonded thereto. One edge 31a of tape 31 overlays finger 18 on ledge 12b while the opposed edge overlays ledge 12a (not shown). Tape 31 may contain copper "bumps" 32 which extend over the bond pads of die 30 and which may be thermocompression bonded to such bond pads. Thus the need of plated-through holes or vias is negated by the use of one-layer tape. As is known in the art, prior to encapsulation and/or test of and typically concurrently with the bonding, portions of the one-layer tape are blanked out (excised) to form separate conductive paths extending from the die bond pads to pin contacts 17 of the overall package. As is known, the outer ends of pin contacts 17 are normally bent so they can be inserted into a printed circuit board or the like.

Figure 8:
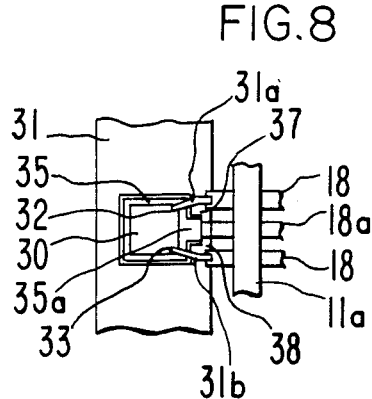
FIG. 8 is a partial top view of the construction of FIG. 7 after excision of portions of the foil.

FIG. 8 illustrates the various connections from a die bond pad 33 to foil portions 31a,31b overlying contact fingers 18. The areas 37, 38 of the foil between foil finger 31a and tab leg 35a and between foil finger 31b and tab leg 35a (and between any other adjacent foil fingers) (not shown) have been excised or blanked out during the die-to-tape bonding operation to form discrete conductive paths between the die bond pads and the contact fingers 18. As illustrated, tab leg 35a is integral with tab 35 and forms a pad which connects tab 35 to ground finger 18a. Upon blanking out of spaces 37, 38 on both sides of foil fingers 31a and 31b, discrete foil connecting fingers 31a,31b are formed connecting the die bond pads 33 and fingers 18. The die bond pads may contain copper "bumps" to aid in the bonding of the tips of the foil fingers to the die bond pads.

Figure 9:
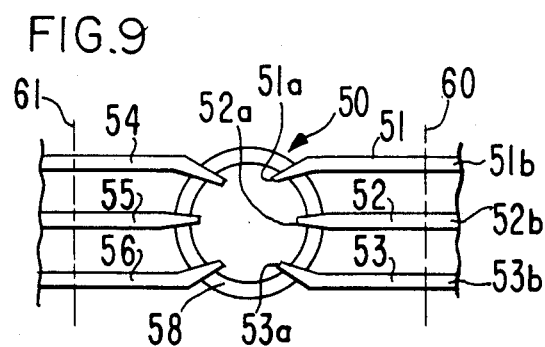
FIG. 9 is a top view of a connector foil usable in the FIG. 5 construction in place of a wire bond connection.

FIG. 9 illustrates an alternative means for bonding the die bond pads to the foil tracings on the insulative tape substrate of FIG. 5, not involving wire bonds. A copper foil tape 50 includes a series of copper foil tracings 51, 52, 53 and 54, 55, 56 which are connected inwardly of their cantilevered ends 51a, 52a, 53a, etc., by a ring 58 of polyimide plastic material affixed thereto to hold the tracings in position. The pattern shown is repeated or replicated along the tape length. The portions of foil tape 50 shown are positioned to bridge across from the die bond pads 42 (in FIG. 5) to the tape bond pads 24,27. The ends 51a, 52a, 53a are bonded to the die bond pads and the opposite ends 51b, 52b, 53b are bonded to tape bond pads 24 and adjacent tape bond pads, for example. As each repetition of foil 50 is bonded to the die and tape bond pads, that repetition is excised from the overall length of foil across tranverse lines 60,61. Thus, each succeeding repetition connects die bond pads of one die to the tape bond pads of the flexible tape 21, basically across the length occupied by bond wires 29 in FIG. 5.

The above description of embodiments of this invention is intended to be illustrative and not limiting. Other embodiments of this invention will be obvious to those skilled in the art in view of the above disclosure.

I claim:

1. A semiconductor package comprising:
    a housing having a depressed interior trough bounded by a flat ledge;
    a flexible tape having electrically conductive bond pads at edges thereof;
    a conductive lead frame having contact fingers resting on said flat ledge and extending outwardly from said housing;
    said tape bond pads extending over said lead frame contact fingers above said ledge;
    means for attaching a semiconductor die having contact bond pads to said tape in said depressed interior trough, said means including a die attach tab integral with said tape and extending in a plane below said tape bond pads;
    means for bonding said tape bond pads to said contact fingers and for bonding selected ones of said die bond pads to said tape bond pads; and
    means for protectively covering said ledge, said tape and said die.

2. The invention set forth in claim 1 in which said die attach tab extends on a substrate tab cantilevered from an interior portion of said tape.

3. The invention set forth in claim 2 in which said die has an upper top surface and a lower back surface and said die attach tab is metallized for electrical contact with the back surface of said die.

4. The invention set forth in claim 3 in which said die attach pad metallized surface is aligned with and is facing away from said housing depressed interior surface.

5. The invention set forth in claim 1 wherein said means for bonding said die contact pad to said tape bond pads comprises bond wires.

6. The invention set forth in claim 1 wherein said means for bonding said bond pads to said lead frame contact fingers comprises reflow solder plated on at least one of abutting surfaces of said bond pads and said lead frame contact fingers.

7. The invention set forth in claim 1 in which a portion of said lead frame is molded in an exterior wall of said housing adjacent said ledge.

8. The invention set forth in claim 1 in which said means for covering comprises a lid affixed to said housing.

9. The invention set forth in claim 1 in which said housing includes peripheral side walls extending above said ledge and said means for covering comprises an encapsulant within the housing bridging said housing side walls.

10. The invention set forth in claim 1 in which said housing has a thermal conductivity of from 10 to 30 cal/sec/cm/° C. and an electrical resistivity of more than $8 \times 10^{-13}$ Ohms at 100° C.

11. The invention set forth in claim 1 in which said tape is a two-layer tape comprising an insulative substrate and a foil pattern of metallic tracings.

12. The invention set forth in claim 1 in which said tape is a one layer foil tape excisable in part to form discrete means for attaching said die bond pads to said tape bond pads.

13. A semiconductor package comprising:
   a longitudinally-extending molded base portion having a longitudinal depending groove extending along an interior surface; said groove having a width to accommodate a semiconductor die and a depth substantially equal to the height of said die;
   said base portion having at least one longitudinal ledge extending outwardly from said groove;
   an upstanding dam integral with said base portion and forming an exterior wall surrounding and upstanding from said ledge;
   a conductive lead frame molded in a longitudinal section of said wall and having contact fingers coplanar with and extending transversely across said ledge, and said contact fingers extending exteriorly of said exterior wall;
   means for bonding contact bond pads on a groove-inserted die to said lead frame contact fingers at the edge of said groove; said means for bonding comprising a flexible flat tape having an attach tab extending laterally on a surface facing the groove-inserted die, said tape bridging across edges of the groove from said die contact pads to said lead frame contact fingers; and
   means for covering said die, die bond pads, said lead frame contact fingers on said ledge and said means for bonding to prevent ingress of moisture to a completed package.

14. The invention set forth in claim 13 in which said flexible tape includes an integral metallized die attach tab formed in a plane below said die bond pads, said die attach tab being positionable on a bottom surface of said groove to make backside electrical contact with said groove-inserted die.

15. A semiconductor package comprising a molded housing having
   an inner longitudinal trough and at least one longitudinal inner ledge extending above said trough;
   a lead frame molded in a wall of said housing and having first contact finger portions extending outwardly from said wall and second contact finger portions extending inwardly from said wall to a planar position on said ledge;
   a flexible electrically conductive tape having bond pads thereon and means for mounting at least one semiconductor die on said tape, said die having bond pads electrically connectible to said tape bond pads;
   wherein said tape is positionable on said ledge and over said trough, and said bond pads of said tape are electrically connected to various of said second contact finger portions of said lead frame; and
   means for protectively covering said tape and said die in said housing.

* * * * *